(12) United States Patent  
Wang et al.

(10) Patent No.: US 11,569,730 B2  
(45) Date of Patent: Jan. 31, 2023

(54) POWER SUPPLY DEVICE AND PULSE FREQUENCY MODULATION METHOD

(71) Applicant: REALTEK SEMICONDUCTOR CORPORATION, Hsinchu (TW)

(72) Inventors: Shih-Cheng Wang, Hsinchu (TW); Hung-Wan Liu, Hsinchu (TW); Shih-Chieh Chen, Hsinchu (TW); Chun-Fu Chang, Hsinchu (TW); Liang-Hui Li, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 120 days.

(21) Appl. No.: 17/155,123

(22) Filed: Jan. 22, 2021

(65) Prior Publication Data

US 2021/0257899 A1 Aug. 19, 2021

(30) Foreign Application Priority Data

Feb. 19, 2020 (TW) .................................. 109105366

(51) Int. Cl.
*H02M 3/158* (2006.01)
*H03K 17/04* (2006.01)
(Continued)

(52) U.S. Cl.
CPC ........... *H02M 1/088* (2013.01); *H02M 3/158* (2013.01); *H03K 3/037* (2013.01); *H03K 5/24* (2013.01); *H03K 17/04* (2013.01)

(58) Field of Classification Search
CPC .... H02M 1/088; H02M 3/158; H02M 1/0012; H02M 1/44; H02M 1/08; H02M 1/083;
(Continued)

(56) References Cited

U.S. PATENT DOCUMENTS 10,476,387 B1* 11/2019 Xi ......................... H02M 3/158
2013/0049716 A1* 2/2013 Saeki .................... H02M 3/156
323/271
(Continued)

OTHER PUBLICATIONS

OA letter of the counterpart TW application (appl. No. 109105360) dated Nov. 6, 2020. Summary of the OA letter: 1.Claims 1-2 and 9-10 are rejected as allegedly being unpatentable over cited reference (US2015/0180341A1). 2.Claims 3-8 are allowable.

*Primary Examiner* — John W Poos
*Assistant Examiner* — Tyler J Pereny
(74) *Attorney, Agent, or Firm* — WPAT, PC

(57) ABSTRACT

A power supply device includes a pulse frequency modulation controller circuitry and a cycle controller circuitry. The pulse frequency modulation controller circuitry is configured to adjust a transiting speed of a first signal according to at least one control bit, and to compare the first signal with a first reference voltage to generate a second signal, and to generate a driving signal to a power converter circuit according to an output voltage, a second reference voltage, and the second signal, in which the power converter circuit is configured to generate the output voltage according to the driving signal. The cycle controller circuitry is configured to detect a frequency of the driving signal according to a clock signal having a predetermined frequency, in which the predetermined frequency is set based on a frequency range capable of being heard by humans.

20 Claims, 7 Drawing Sheets

(51) Int. Cl.
*H03K 5/24* (2006.01)
*H03K 3/037* (2006.01)
*H02M 1/088* (2006.01)

(58) Field of Classification Search
CPC ...... H02M 3/157; H02M 3/335; H02M 3/156; H02M 1/0032; H02M 1/0025; H02M 3/33507; H02M 1/0009; H02M 3/33523; H02M 1/0016; H02M 3/1588; H02M 3/3376; H02M 7/53871; H02M 1/0022; H02M 3/1566; H02M 3/33515; H03K 3/037; H03K 5/24; H03K 17/04; H03K 7/06; H03K 7/08; H03K 3/017; H03F 3/217; H03F 3/2171; H03F 3/2173
See application file for complete search history.

(56) References Cited

U.S. PATENT DOCUMENTS

| | | | |
|---|---|---|---|
| 2015/0180341 A1 | 6/2015 | Yuan | |
| 2016/0065701 A1* | 3/2016 | Shepard | H04L 27/148 713/323 |
| 2017/0264299 A1* | 9/2017 | Kim | H03L 7/091 |

* cited by examiner

POWER SUPPLY DEVICE AND PULSE FREQUENCY MODULATION METHOD

BACKGROUND OF THE INVENTION

1. Field of the Invention

The present disclosure relates to a power supply device. More particularly, the present disclosure relates to a power supply device having a pulse frequency modulation and a pulse frequency modulation method thereof.

2. Description of Related Art

A power supply device is commonly utilized in various electronic devices, in order to provide a stable supply voltage to internal circuits of the electronic device. In practical audio/video application electronic devices (e.g., mobile phone, wireless headphone, wireless speaker), switching operations of the power supply device may cause noises. As a result, a user may hear theses noises when using such electronic device, and thus results in a poor user's experience.

SUMMARY OF THE INVENTION

In some embodiments, a power supply device includes a pulse frequency modulation controller circuitry and a cycle controller circuitry. The pulse frequency modulation controller circuitry is configured to adjust a transiting speed of a first signal according to at least one control bit, and to compare the first signal with a first reference voltage to generate a second signal, and to generate a driving signal to a power converter circuit according to an output voltage, a second reference voltage, and the second signal, in which the power converter circuit is configured to generate the output voltage according to the driving signal. The cycle controller circuitry is configured to detect a frequency of the driving signal according to a clock signal having a predetermined frequency, in which the predetermined frequency is set based on a frequency range capable of being heard by humans.

In some embodiments, a pulse frequency modulation method includes the following operations: adjusting a transiting speed of a first signal according to at least one control bit, and comparing the first signal with a first reference voltage, in order to generate a second signal; generating a driving signal to a power converter circuit according to an output voltage, a second reference voltage, and the second signal, in which the power converter circuit is configured to generate the output voltage according to the driving signal; and detecting a frequency of the driving signal according to a clock signal having a predetermined frequency, in order to adjust the at least one control bit, in which the predetermined frequency is set based on a frequency range capable of being heard by humans.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
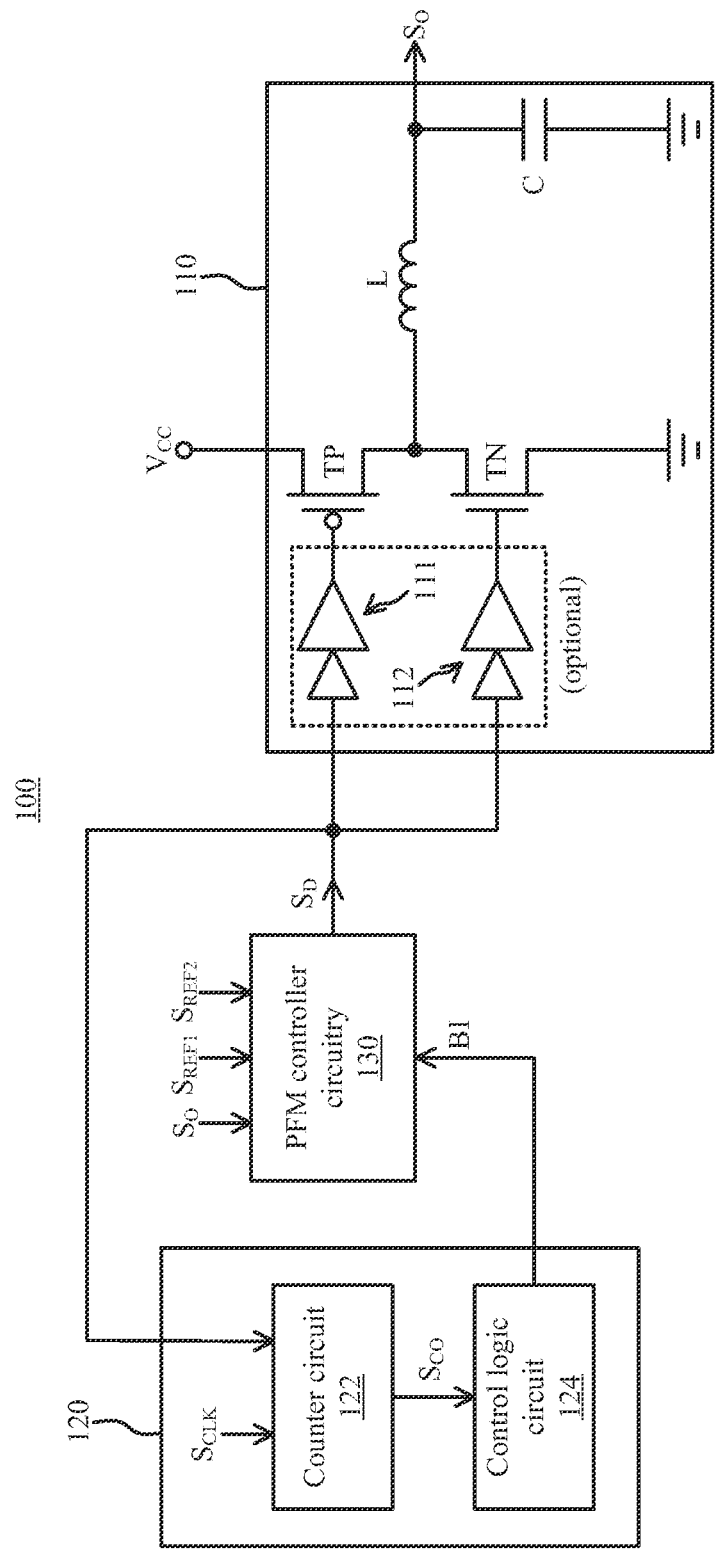
FIG. 1 is a schematic diagram of a power supply device according to some embodiments of the present disclosure.

FIG. 1 is a schematic diagram of a power supply device 100 according to some embodiments of the present disclosure. In some embodiments, the power supply device 100 may be applied to various electronic devices (e.g., mobile phone, wireless headphone, Bluetooth speaker, etc.). The power supply device 100 is able to prevent a frequency of internal electrical signal(s) from falling within a frequency range capable of being heard by humans (which may be about 20 to 20 kHz), such that a user's listening experience is prevented from being suffered by noises of the electronic device.

The power supply device 100 includes a power converter circuit 110, a cycle controller circuitry 120, and a pulse frequency modulation (PFM) controller circuitry 130. The power converter circuit 110 converts a voltage $V_{CC}$ to an output voltage $S_O$ according to a driving signal $S_D$. The power converter circuit 110 includes a buffer 111, a buffer 112, a switch TP, a switch TN, an inductor L, and a capacitor C. The switch TP receives the driving signal $S_D$ via the buffer 111. The switch TN receives the driving signal $S_D$ via the buffer 112. The switch TP is a P-type transistor that is configured to be turned on according to the driving signal $S_D$, in order to charge the capacitor C via the inductor L. As a result, the output voltage $S_O$ is increased. The switch TN is an N-type transistor that is configured to be turned on according to the driving signal $S_D$, in order to discharge the capacitor C via the inductor L. The above configurations of the power converter circuit 110 are given for illustrative purposes, and the present disclosure is not limited thereto. For example, in some optional embodiments, the buffer 111 and/or the buffer 112 are not employed. In other words, the switch TP and/or the switch TN may receive the driving signal $S_D$ directly.

The cycle controller circuitry 120 detects a frequency of the driving signal $S_D$ according to a clock signal $S_{CLK}$ having a predetermined frequency (e.g., $F_{CLK}$ shown in FIG. 5A), in order to adjust at least one control bit BI. In some embodiments, the predetermined frequency of the clock signal $S_{CLK}$ is set based on the frequency range capable of being heard by humans. For example, the predetermined frequency may be set to be 32 kHz that is higher than a highest frequency in the frequency range capable of being heard by humans, but the present disclosure is not limited thereto. As described in later paragraphs, the cycle controller circuitry 120 is able to adjust the at least one control bit BI, in order to prevent the frequency of the driving signal $S_D$ from falling within the frequency range capable of being heard by humans. The PFM controller circuitry 130 generates the driving signal $S_D$ according to the at least one control bit BI, a reference voltage $S_{REF1}$, a reference voltage $S_{REF2}$, and the output voltage $S_O$.

Figure 2A:
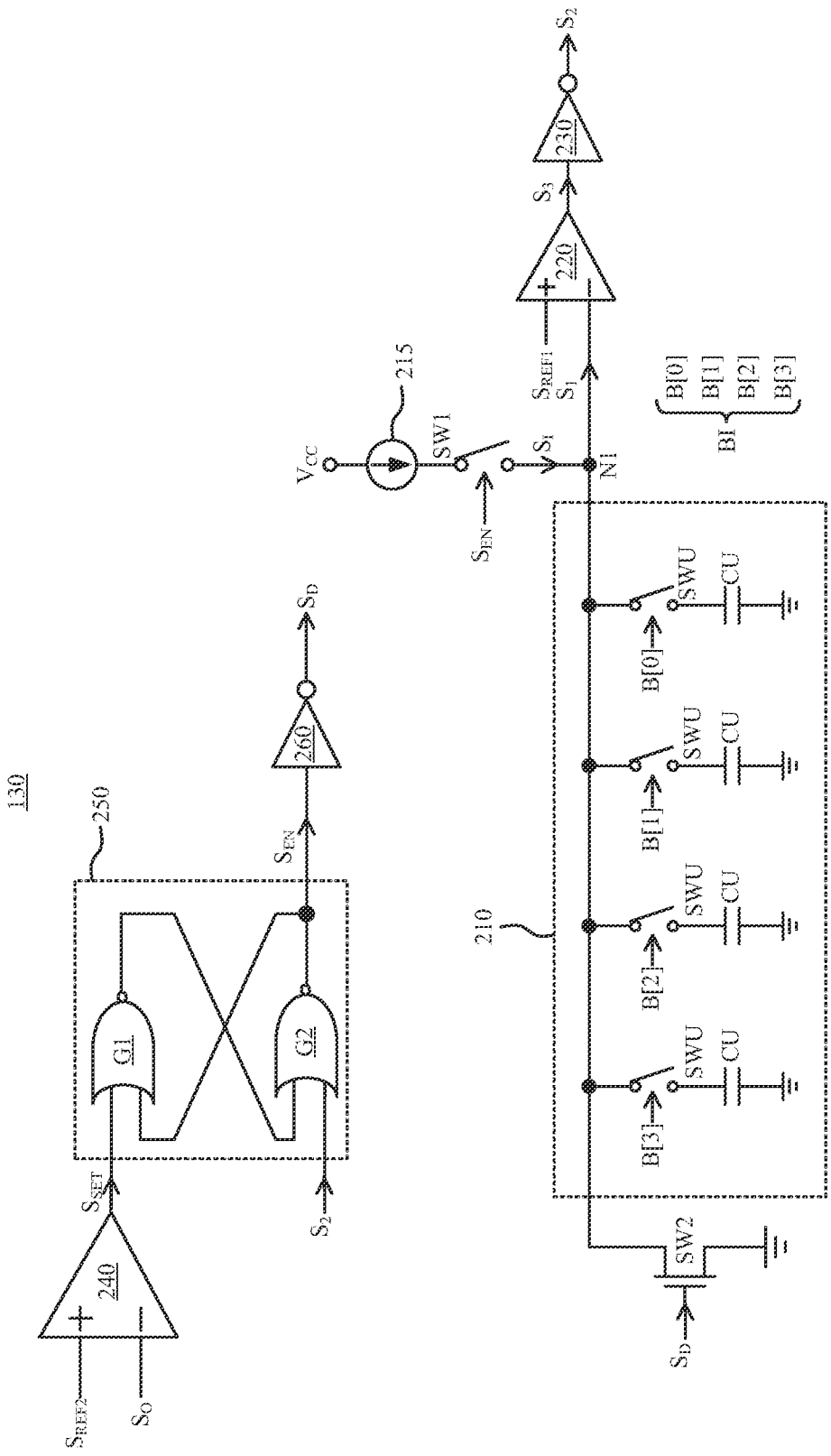
FIG. 2A is a schematic diagram of the pulse width modulation (PFM) controller circuitry in FIG. 1 according to some embodiments of the present disclosure.

FIG. 2A is a schematic diagram of the PFM controller circuitry 130 in FIG. 1 according to some embodiments of the present disclosure. In some embodiments, the PFM controller circuitry 130 adjusts a transiting speed of a signal $S_1$ of a node N1, and compares the signal $S_1$ with the reference voltage $S_{REF1}$ to generate a signal $S_2$. The PFM controller circuitry 130 further generates the driving signal $S_D$ according to the output voltage $S_O$, the reference voltage $S_{REF2}$, and the signal $S_2$.

For ease of illustration, FIG. 2A is given with examples where the at least control bit BI includes four control bits B[0]-B[3]. It should be understood that the bit number of the at least one control bit BI is not limited thereto. The PFM controller circuitry 130 includes a switched-capacitor array circuit 210, a switch SW1, a current source circuit 215, a switch SW2, a comparator circuit 220, and an inverter circuit 230. The switched-capacitor array circuit 210 determines a capacitance value of the node N1 according to the control bits B[0]-B[3]. For example, the switched-capacitor array circuit 210 includes capacitors CU and switches SWU. First terminals of the capacitors CU are coupled to ground. Each of the switches SWU is coupled between a second terminal of a corresponding one of the capacitors CU and the node N1, and is turned on (i.e., closed or conducted) according to a corresponding one of the control bits B[0]-B[3]. If a number of switches being turned on in the switches SWU is more, the number of the capacitors CU being coupled in parallel is more. As a result, the capacitance value of the node N1 is higher. Alternatively, if the number of switches being turned on in the switches SWU is less, the number of the capacitors CU being coupled in parallel is less. As a result, the capacitance value of the node N1 is lower.

The above configurations of the switched-capacitor array circuit 210 and the number of elements (e.g., the switches SWU and the capacitors CU) in the switched-capacitor array circuit 210 are given for illustrative purposes, and the present disclosure is not limited thereto. According to practical requirements, the number of elements in the switched-capacitor array circuit 210 may be one or more.

The current source circuit 215 provides a current signal $S_1$. The switch SW1 is coupled between the current source circuit 215 and the node N1, and is turned on according to an enable signal $S_{EN}$ to transmit the current signal $S_1$ to the node N1, in order to charge the node N1 to generate the signal $S_1$. If the capacitance value of the node N1 is higher, the charging time is longer, and thus the transiting speed of the signal $S_1$ is slower. Alternatively, if the capacitance value of the node N1 is lower, the charging time is shorter, and thus the transiting speed of the signal $S_1$ is faster.

The switch SW2 is selectively turned on according to the driving signal $S_D$, in order to reset the level of the node N1. In this example, the switch SW2 is implemented with an N-type transistor. The comparator circuit 220 compares the reference voltage $S_{REF1}$ with the signal $S_1$, in order to generate a signal $S_3$. The inverter circuit 230 generates the signal $S_2$ according to the signal $S_3$.

The PFM controller circuitry 130 further includes a comparator circuit 240, a SR latch circuit 250, and an inverter circuit 260. The comparator circuit 240 compares the output voltage $S_O$ with the reference voltage $S_{REF2}$, in order to generate a set signal $S_{SET}$. The SR latch circuit 250 generates the enable signal $S_{EN}$ according to the set signal $S_{SET}$ and the signal $S_2$. In this example, the SR latch circuit 250 includes a NOR gate circuit G1 and a NOR gate circuit G2. The inverter circuit 260 generates the driving signal $S_D$ according to the enable signal $S_{EN}$.

Figure 2B:
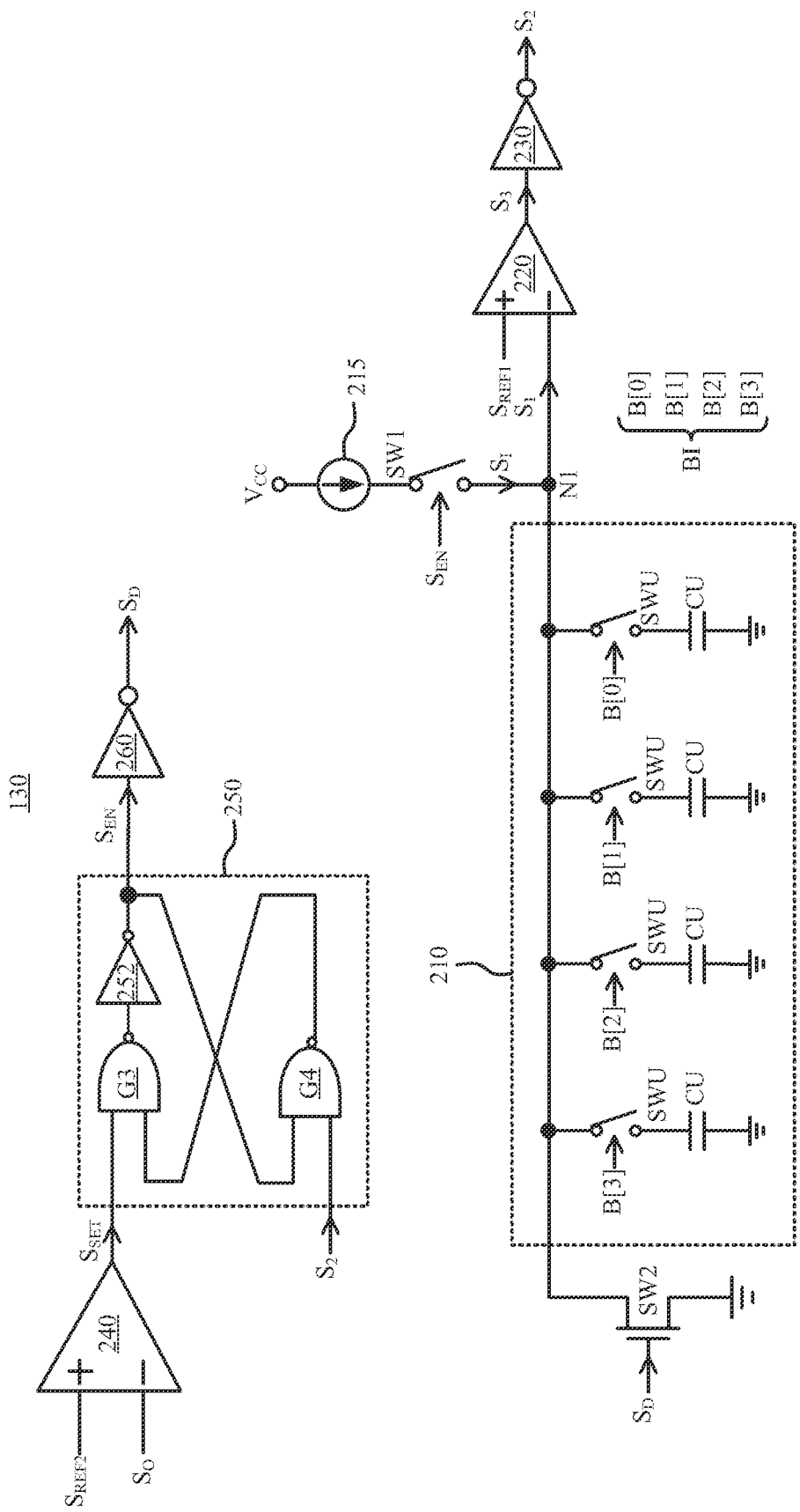
FIG. 2B is a schematic diagram of the PFM controller circuitry in FIG. 1 according to some embodiments of the present disclosure.

FIG. 2B is a schematic diagram of the PFM controller circuitry 130 in FIG. 1 according to some embodiments of the present disclosure. Compared with FIG. 2A, in this example, the SR latch circuit 250 includes an NAND gate circuit G3, an NAND gate circuit G4, and an inverter circuit 252. In other words, in some embodiments, the SR latch circuit 250 may be implemented with NOR gate circuits (i.e., FIG. 2A). Alternatively, in some embodiments, the SR latch circuit 250 may be implemented with NAND gate circuits (i.e., FIG. 2B).

Figure 3:
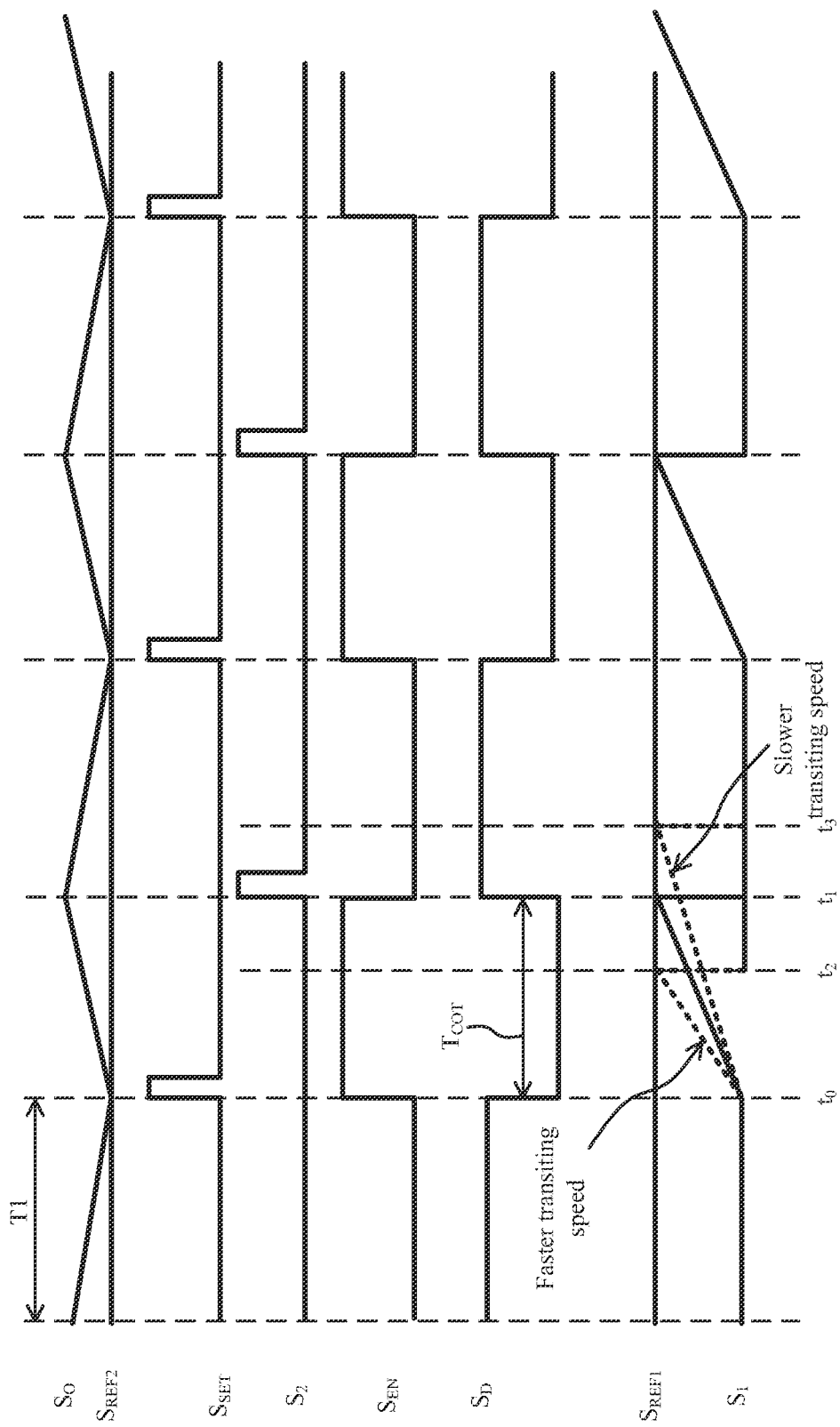
FIG. 3 is a waveform diagram of signals in FIG. 2A (or FIG. 2B) according to some embodiments of the present disclosure.

FIG. 3 is a waveform diagram of signals in FIG. 2A (or FIG. 2B) according to some embodiments of the present disclosure. In order to illustrate operations of the power supply device 100 in FIG. 1, reference is now made to FIG. 1, FIG. 2A (or FIG. 2B), and FIG. 3. During an interval T1, the driving signal $S_D$ has a logic value of 1 (i.e., the driving signal $S_D$ has a high level), and the enable signal $S_{EN}$ has a logic value of 0 (i.e., the enable signal $S_{EN}$ has a low level). In response to this driving signal $S_D$, the switch TP is turned off, and the switch TN is turned on. As a result, the capacitor C is not able to be charged by the voltage $V_{CC}$, and is only charged by the inductor L. Under this condition, if a load device (not shown) is coupled to the power supply device 100 to receive the output voltage $S_O$ (i.e., to drain a current from the power supply device 100), the output voltage $S_O$ is getting lower.

At time $t_0$, when the output voltage $S_O$ is lower than (or equal to) the reference voltage $S_{REF2}$, the comparator circuit 240 outputs the set signal $S_{SET}$ having the logic value of 1.

In response to this the set signal $S_{SET}$ and the signal $S_2$ having the logic value of 0, the SR latch circuit 250 outputs the enable signal $S_{EN}$ having the logic value of 1. As a result, the inverter circuit 260 outputs the driving signal $S_D$ having the logic value of 0. In response to this driving signal $S_D$, the switch TP is turned on, and the switch TN is turned off. Under this condition, the capacitor C is charged via the switch TP, and thus the output voltage $S_O$ is getting higher. When the output voltage $S_O$ is higher than the reference voltage $S_{REF2}$, the comparator circuit 240 outputs the set signal $S_{SET}$ having the logic value of 0. Moreover, in response to the enable signal $S_{EN}$ having the logic value of 1, the switch SW1 is turned on, and thus the node N1 is charged by the current signal $S_1$. As a result, the level of the signal $S_1$ is getting higher.

At time $t_1$, when the signal $S_1$ is higher than or equal to the reference voltage $S_{REF1}$, the comparator circuit 220 outputs the signal $S_3$ having the logic value of 0. In response to this signal $S_3$ and the set signal $S_{SET}$ having the logic value of 0, the inverter circuit 230 outputs the signal $S_2$ having the logic value of 1. In response to this signal $S_2$ and the set signal $S_{SET}$ having the logic value of 0, the SR latch circuit 250 outputs the enable signal $S_{EN}$ having the logic value of 0. As a result, the inverter circuit 260 outputs the driving signal $S_D$ having the logic value of 1. In response to this driving signal $S_D$, the switch TP is turned off, and the switch TN is turned on. Accordingly, the capacitor C is not able to be charged by the voltage $V_{CC}$, and is only charged by the inductor L. Under this condition, if the load device (not shown) is coupled to the power supply device 100 to receive the output voltage $S_O$, the output voltage $S_O$ is getting lower. By this analogy, based on the control of the PFM controller circuitry 130, the power converter circuit 110 is able to regulate the output voltage $S_O$ according to the driving signal $S_D$.

With the above operations, the capacitance value of the node N1 can be adjusted to adjust a constant on-time $T_{COT}$ of driving signal $S_D$. For example, if the capacitance value of the node N1 is smaller, the transiting speed of the signal $S_1$ is faster. Under this condition, the signal $S_1$ will be higher than or equal to the reference voltage $S_{REF1}$ at time $t_2$ which is earlier than time $t_1$. Accordingly, the inverter circuit 230 outputs the signal $S_2$ having the logic value of 1 at time $t_2$, such that the inverter circuit 260 outputs the driving signal $S_D$ having the logic value of 1 rapidly. Alternatively, if the capacitance value of the node N1 is bigger, the transiting speed of the signal $S_1$ is slower. Under this condition, the signal $S_1$ is higher than or equal to the reference voltage $S_{REF1}$ at time $t_3$ which is later than time $t_1$. Accordingly, the inverter circuit 230 outputs the signal $S_2$ having the logic value of 1 at time $t_3$, such that the inverter circuit 260 outputs the driving signal $S_D$ having the logic value of 1 slowly.

Figure 4:
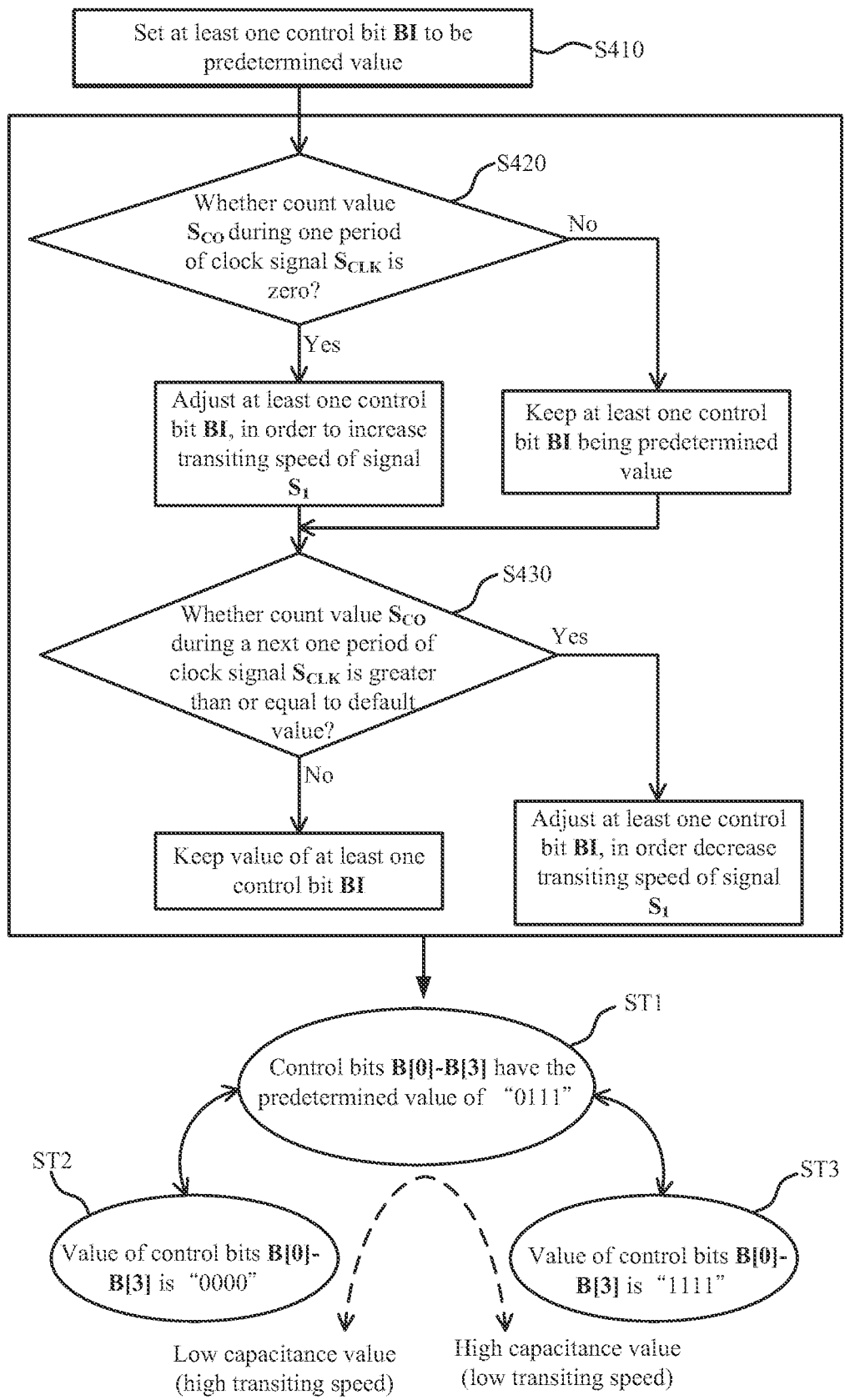
FIG. 4 is a flow chart of operations of the cycle controller circuitry in FIG. 1 according to some embodiments of the present disclosure.

FIG. 4 is a flow chart of operations of the cycle controller circuitry 120 in FIG. 1 according to some embodiments of the present disclosure. As described above, the cycle controller circuitry 120 detects the frequency of the driving signal $S_D$ according to the clock signal $S_{CLK}$, in order to adjust the at least one control bit BI. In some embodiments, as shown in FIG. 1, the cycle controller circuitry 120 includes a counter circuit 122 and a control logic circuit 124. The counter circuit 122 is reset according to the clock signal $S_{CLK}$, in order to count a number of pulses in the driving signal $S_D$, in order to generate a count value $S_{CO}$. In some embodiments, the counter circuit 122 may be an up counter. The control logic circuit 124 performs operations in FIG. 4 according to the count value $S_{CO}$, in order to adjust the at least one control bit BI. In some embodiments, the control logic circuit 124 may be implemented with one or more digital circuits, and the one or more digital circuits are configured to be a state machine that performs operations in FIG. 4. The above implementations of the cycle controller circuitry 120 are given for illustrative purposes, and the present disclosure is not limited thereto.

In operation S410, the at least one control bit BI is set to be a predetermined value. For example, the control logic circuit 124 includes a register (not shown), which stores the predetermined value of the at least one control bit BI. In this operation, the control logic circuit 124 outputs the at least one control BI having the predetermined value via the register. Taking FIG. 2A as an example, the predetermined value of the control bits B [0]-B[3] may be "0111." In response to this predetermined value, three capacitors CU in the switched-capacitor array circuit 210 are coupled in parallel to each other.

In operation S420, whether the counter value $S_{CO}$ is zero during one period of the clock signal $S_{CLK}$ is determined. If the counter value $S_{CO}$ is zero, the at least one control bit BI is adjusted to increase the transiting speed of the signal $S_1$. If the counter value $S_{CO}$ is not zero, the at least one control bit BI is kept to be the predetermined value.

Figure 5:
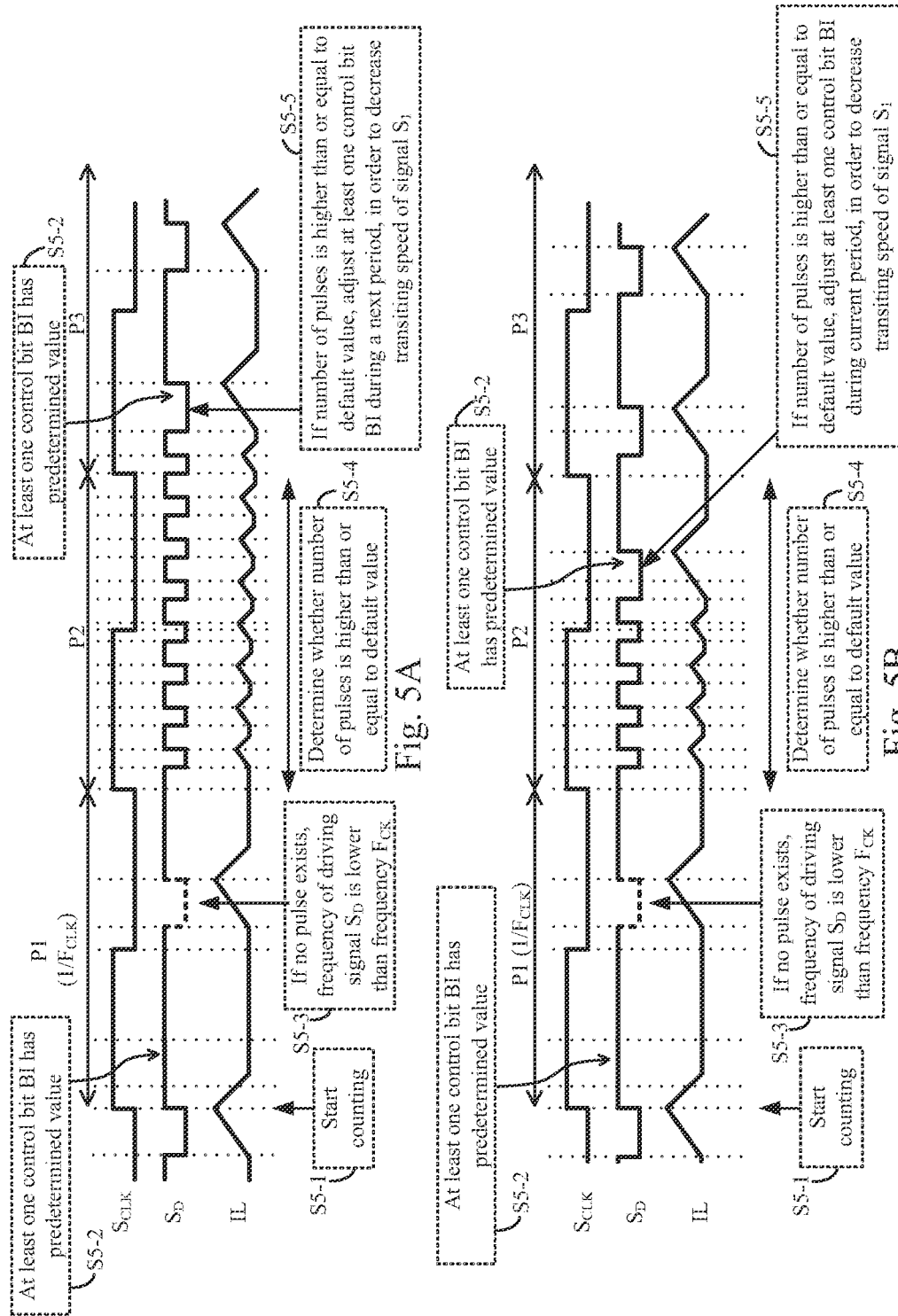
FIG. 5A is a waveform diagram of part signals in FIG. 1 according to some embodiments of the present disclosure.
FIG. 5B is a waveform diagram of part signals in FIG. 1 according to some embodiments of the present disclosure.

For ease of understanding, reference is now made to FIG. 5A. FIG. 5A is a waveform diagram of part signals in FIG. 1 according to some embodiments of the present disclosure. In FIG. 5A, the predetermined frequency $F_{CLK}$ of the clock signal $S_{CLK}$ is set to be 32 kHz, a period of the clock signal $S_{CLK}$ is $1/F_{CLK}$, and a current IL is a current flowing through the inductor L.

During a first period P1, the counter circuit 122 is triggered to count the number of pulses in the driving signal $S_D$ (i.e., step S5-1), and the control bits B[0]-B[3] are configured to be the predetermined value (i.e., step S5-2 which corresponds to operation S410). If there is at least one pulse in the driving signal $S_D$ within the first period P1 (i.e., the count value $S_{CO}$ is 1), it indicates that the frequency of the driving signal $S_D$ is higher than the frequency $F_{CLK}$ and will not fall within the frequency range capable of being heard by humans. Accordingly, the control logic circuit 124 keeps the control bits B[0]-B[3] being as the predetermined value.

Alternatively, if there is no pulse exists in the driving signal $S_D$ during the first period P1 (i.e., the count value $S_{CO}$ is 0), it indicates that the frequency of the driving signal $S_D$ is lower than the frequency $F_{CLK}$ and may fall within the frequency range capable of being heard by humans (i.e., step S5-3). Accordingly, the control logic circuit 124 adjusts the control bits B[0]-B[3] (e.g., switching the control bits B[0]-B[3] to "0000"), such that the switched-capacitor array circuit 210 provides a lower capacitance value to increase the transiting speed of the signal $S_1$. As a result, the frequency of the driving signal $S_D$ can be increased, in order to be prevented from falling within the frequency range capable of being heard by humans.

With continued reference to FIG. 4, in operation S430, whether the count value $S_{CO}$ is greater than or equal to a default value during a next period of the clock signal $S_{CLK}$ is determined (i.e., step S5-4 in FIG. 5A). If the count value $S_{CO}$ is greater than or equal to the default value, the at least one control bit BI is adjusted to decrease the transiting speed of the signal $S_1$. If the count value $S_{CO}$ is less than the default value, the value of the at least one control bit BI is kept.

Reference is made to FIG. 5A, if the number of pulses in the driving signal $S_D$ during a second period P2 is less than the default value (which may be, for example, 16/32/48/62, etc.), it indicates that the power converter circuit 110 operates under the light load. Accordingly, the control logic circuit 125 keeps the values of the control bits B[0]-B[3] being fixed.

Alternatively, the number of pulses in the driving signal $S_D$ during the second period P2 is greater than or equal to the default value, it indicates that the power converter circuit 110 operates under the heavy load. Accordingly, the control logic circuit 124 adjusts the control bits B[0]-B[3] (for example, switching the control bits B[0]-B[3] to the predetermined value) during a next period (i.e., a third period P3). As a result, the switched-capacitor array circuit 210 is able to provide a higher capacitance value to decrease the transiting speed of the signal $S_1$ (i.e., step S5-5). With the above configuration, the frequency of the driving signal $S_D$ can be prevented from getting too high, in order to keep the current driving ability of the power converter circuit 110 under the heavy load.

In some embodiments, if the number of pulses in the driving signal $S_D$ during a next period is still higher than the default value, it indicates that the power converter circuit 110 still operates under the heavy load. Accordingly, the control logic circuit 124 may further adjust the control bits B[0]-B[3] (for example, switching the control bits B[0]-B[3] to "1111"). As a result, the switched-capacitor array circuit 210 is able to provide a higher capacitance value to decrease the transiting speed of the signal $S_1$. As shown in FIG. 4, the above operations S420 to S430 can be considered as three states ST1-ST3. At the state ST1, the control bits B[0]-B[3] have the predetermined value of "0111," and correspond to a second high capacitance value. At the state ST2, the control bits B[0]-B[3] have the value of "0000," and corresponds to a lowest capacitance value. At the state ST3, the control bits B[0]-B[3] has the value of "1111." According to the load condition and the frequency range capable of being heard by humans, the control logic circuit 124 is able to sequentially adjust the control bits B[0]-B[3] with reference to these states.

The number to these states is given for illustrative purposes, and the present disclosure is not limited thereto. According to practical design requirements, the number of the states, the default value, and/or a number of elements in the switched-capacitor array circuit 210 can be adjusted correspondingly. For example, in some embodiments, the switched-capacitor array circuit 210 may include more smaller capacitors (not shown), which are configured to fine tune the capacitance value of the switched-capacitor array circuit 210 according to additional bits of the at least one control bit BI.

FIG. 5B is a waveform diagram of part signals in FIG. 1 according to some embodiments of the present disclosure. Compared with FIG. 5A, in this example, if the number of pulses in the driving signal $S_D$ during the second period P2 is higher than or equal to the default value, the control logic circuit 124 instantly adjusts the control bits B[0]-B[3] during the current period (for example, switching the control bits B[0]-B[3] to the predetermined value). As a result, a higher current can be instantly provided in response to the requirement of the heavy load.

Figure 6:
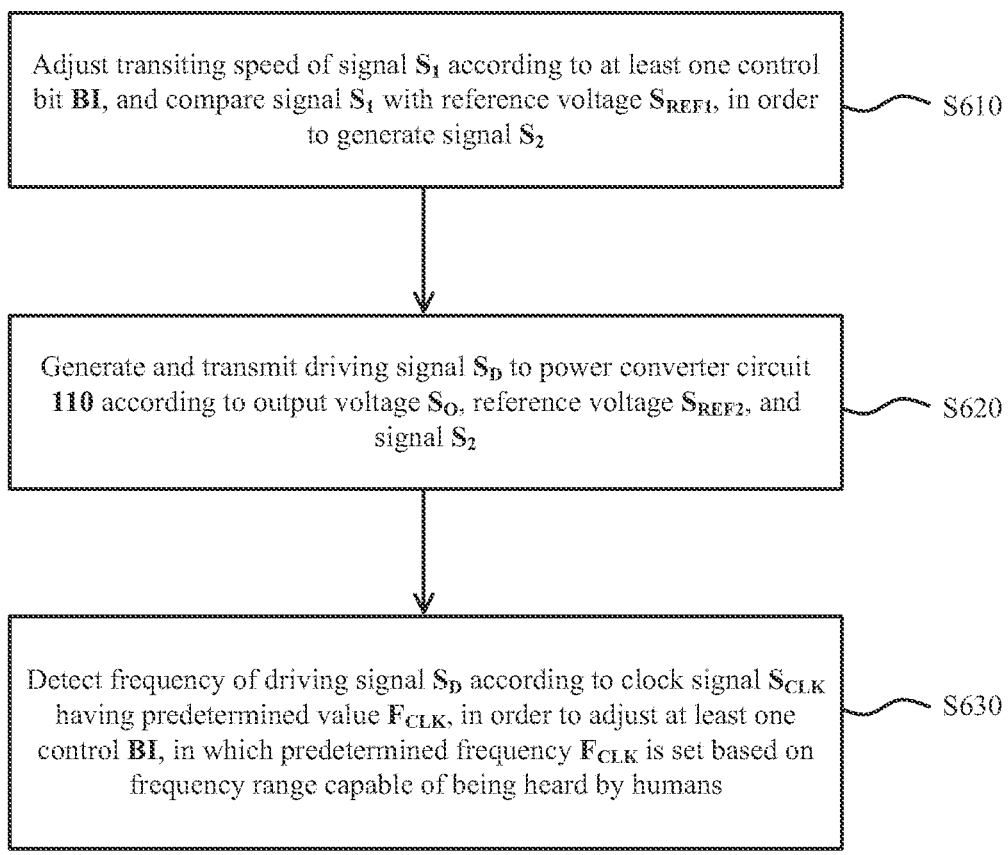
FIG. 6 is a flow chart of a PFM method according to some embodiments of the present disclosure.

FIG. 6 is a flow chart of a PFM method 600 according to some embodiments of the present disclosure. In operation S610, the transiting speed of the signal $S_1$ is adjusted according to the at least one control bit BI, and the signal $S_1$ is compared with the reference voltage $S_{REF1}$ to generate the signal $S_2$. In operation S620, the driving signal $S_D$ is generated and transmitted to the power converter circuit 110 according to the output voltage $S_O$, the reference voltage $S_{REF2}$, and the signal $S_2$. In operation S630, the frequency of the driving signal $S_D$ is detected according to the clock signal $S_{CLK}$ having the predetermined frequency $F_{CLK}$, in order to adjust the at least one control bit BI, in which the predetermined frequency $F_{CLK}$ is set based on the frequency range capable of being heard by humans.

The above operations can be understood with reference to the above embodiments, and thus the repetitious descriptions are not further given. The above description of the PFM method 600 includes exemplary operations, but the operations of the PFM method 600 are not necessarily performed in the order described above. The order of the operations of the PFM method 600 can be changed, or the operations can be executed simultaneously or partially simultaneously as appropriate, in accordance with the spirit and scope of various embodiments of the present disclosure.

As described above, the power supply device and the PFM method provided in some embodiments of the present disclosure are able to prevent a switching frequency from falling within the frequency range capable of being heard by humans, in order to improve a user's hearing experience.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A power supply device, comprising:
   a pulse frequency modulation controller circuitry configured to adjust a capacitance value of a node that outputs a first signal according to at least one control bit to adjust a transiting speed of the first signal, and to compare the first signal with a first reference voltage to generate a second signal, and to generate a driving signal to a power converter circuit according to an output voltage, a second reference voltage, and the second signal, wherein the power converter circuit is configured to generate the output voltage according to the driving signal; and
   a cycle controller circuitry configured to detect a frequency of the driving signal according to a clock signal having a predetermined frequency, wherein the predetermined frequency is set based on a frequency range capable of being heard by humans.

2. The power supply device of claim 1, wherein the cycle controller circuitry is configured to adjust the at least one control bit, in order to prevent the frequency of the driving signal from falling within the frequency range capable of being heard by humans.

3. The power supply device of claim 1, wherein the pulse frequency modulation controller circuitry comprises:
a switched-capacitor array circuit configured to determine the capacitance value of the node according to the at least one control bit;
a first switch configured to be turned on according to an enable signal to output a current signal, in order to charge the node to generate the first signal;
a second switch configured to be selectively turned on according to the driving signal, in order to reset a level of the node;
a comparator circuit configured to compare the first reference voltage with the first signal, in order to generate a third signal; and
an inverter circuit configured to generate the second signal according to the third signal.

4. The power supply device of claim 3, wherein the switched-capacitor array circuit comprises:
at least one capacitor; and
at least one third switch coupled between the at least one capacitor and the node, wherein each of the at least one third switch is configured to be turned on according to a corresponding one of the at least one control bit.

5. The power supply device of claim 1, wherein the pulse frequency modulation controller circuitry comprises:
a comparator circuit configured to compare the output voltage with the second reference voltage, in order to generate a set signal;
a SR latch circuit configured to generate an enable signal according to the set signal and the second signal; and
an inverter circuit configured to generate the driving signal according to the enable signal.

6. The power supply device of claim 5, wherein the SR latch circuit comprises a plurality of NOR gate circuits or a plurality of NAND gate circuit.

7. The power supply device of claim 1, wherein the cycle controller circuitry is configured to count a number of pulses in the driving signal during a period of the clock signal, in order to generate a count value, and to adjust the at least one control bit according to the count value.

8. The power supply device of claim 7, wherein if the count value is zero, the cycle controller circuitry is configured to adjust the at least one control bit, in order to increase the transiting speed of the first signal.

9. The power supply device of claim 7, wherein if the count value is greater than or equal to a default value, the cycle controller circuitry is configured to adjust the at least one control bit during the period of the clock signal, in order to decrease the transiting speed of the first signal.

10. The power supply device of claim 7, wherein if the count value is greater than or equal to a default value, the cycle controller circuitry is configured to adjust the at least one control bit during a next period of the clock signal, in order to decrease the transiting speed of the first signal.

11. The power supply device of claim 1, wherein the predetermined frequency is higher than a highest frequency in the frequency range capable of being heard by humans.

12. A pulse frequency modulation method, comprising:
adjusting a capacitance value of a node that outputs a first signal according to at least one control bit to adjust a transiting speed of the first signal, and comparing the first signal with a first reference voltage, in order to generate a second signal;
generating a driving signal to a power converter circuit according to an output voltage, a second reference voltage, and the second signal, wherein the power converter circuit is configured to generate the output voltage according to the driving signal; and
detecting a frequency of the driving signal according to a clock signal having a predetermined frequency, in order to adjust the at least one control bit, wherein the predetermined frequency is set based on a frequency range capable of being heard by humans.

13. The pulse frequency modulation method of claim 12, wherein the at least one control bit is adjusted to prevent the frequency of the driving signal from falling within the frequency range capable of being heard by humans.

14. The pulse frequency modulation method of claim 12, wherein adjusting the capacitance value of the node that outputs the first signal according to the at least one control bit to adjust the transiting speed of the first signal, and comparing the first signal with the first reference voltage, in order to generate the second signal comprises:
controlling a switched-capacitor array circuit according to the at least one control bit, in order to determine the capacitance value of the node;
outputting a current signal according to an enable signal, in order to charge the node to generate the first signal;
selectively setting a level of the node according to the driving signal;
comparing with the first reference voltage with the first signal, in order to generate a third signal; and
generating the second signal according to the third signal, wherein the third signal and the second signal have opposite logic values.

15. The pulse frequency modulation method of claim 12, wherein generating the driving signal to the power converter circuit according to the output voltage,
the second reference voltage, and the second signal comprises:
comparing the output with the second reference voltage, in order to generate a set signal;
generating, by a SR latch circuit, an enable signal according to the set signal and the second signal; and
generating the driving signal according to the enable signal, wherein the enable signal and the driving signal have opposite logic values.

16. The pulse frequency modulation method of claim 12, wherein detecting the frequency of the driving signal according to the clock signal having the predetermined frequency, in order to adjust the at least one control bit comprises:
counting a number of pulses in the driving signal during a period of the clock signal, in order to generate a count value, and adjusting the at least one control bit according to the count value.

17. The pulse frequency modulation method of claim 16, wherein adjusting the at least one control bit according to the count value comprises:
if the count value is greater than or equal to a default value, adjusting the at least one control bit during the period, in order to decrease the transiting speed of the first signal.

18. The pulse frequency modulation method of claim 16, wherein adjusting the at least one control bit according to the count value comprises:
if the count value is greater than or equal to a default value, adjusting the at least one control bit during a next period of the clock signal, in order to decrease the transiting speed of the first signal.

19. The pulse frequency modulation method of claim 16, wherein adjusting the at least one control bit according to the count value comprises:
   if the count value is zero, adjusting the at least one control bit, in order to increase the transiting speed of the first signal.

20. The pulse frequency modulation method of claim 12, wherein the predetermined frequency is higher than a highest frequency in the frequency range capable of being heard by humans.

\* \* \* \* \*